(12) United States Patent
Brown (10) Patent No.: US 9,116,057 B2
(45) Date of Patent: Aug. 25, 2015

(54) INTEGRATED REFERENCE VACUUM PRESSURE SENSOR WITH ATOMIC LAYER DEPOSITION COATED INPUT PORT

(71) Applicant: Honeywell International Inc., Morristown, MN (US)

(72) Inventor: Gregory C. Brown, Chanhassen, MN (US)

(73) Assignee: Honeywell International Inc., Morristown, NJ (US)

( * ) Notice: Subject to any disclaimer, the term of this patent is extended or adjusted under 35 U.S.C. 154(b) by 284 days.

(21) Appl. No.: 13/778,445

(22) Filed: Feb. 27, 2013

(65) Prior Publication Data
US 2014/0238141 A1    Aug. 28, 2014

(51) Int. Cl.
| G01L 7/00 | (2006.01) |
| G01L 9/00 | (2006.01) |
| G01L 19/14 | (2006.01) |
| G01L 19/06 | (2006.01) |

(52) U.S. Cl.
CPC .............. *G01L 9/0033* (2013.01); *G01L 9/0055* (2013.01); *G01L 19/0654* (2013.01); *G01L 19/145* (2013.01)

(58) Field of Classification Search
CPC .............. G01L 19/0645; G01L 19/147; G01L 19/0007
USPC .............. 73/706, 700, 715, 754, 756; 96/118; 238/176; 156/293
See application file for complete search history.

(56) References Cited

U.S. PATENT DOCUMENTS

| 4,790,192 | A |  | 12/1988 | Knecht et al. |
| 4,846,191 | A |  | 7/1989 | Brockway et al. |
| 6,229,190 | B1 |  | 5/2001 | Bryzek et al. |
| 6,255,728 | B1 |  | 7/2001 | Nasiri et al. |
| 6,431,003 | B1 |  | 8/2002 | Stark et al. |
| 7,775,119 | B1 |  | 8/2010 | Suminto et al. |
| 8,215,176 | B2 |  | 7/2012 | Ding et al. |
| 8,297,125 | B2 | * | 10/2012 | Stewart et al. .................. 73/716 |
| 8,316,725 | B2 | * | 11/2012 | Wade ....................... 73/862.627 |
| 2008/0110269 | A1 |  | 5/2008 | Strietzel et al. |

(Continued)

OTHER PUBLICATIONS

Brown, "Systems and Methods for a Pressure Sensor Having a Two Layer Die Structure", "U.S. Appl. No. 13/778,465, Client Case No. H0038035-5869, filed Feb. 27, 2013", pp. 1-32.

(Continued)

*Primary Examiner* — Lisa Caputo
*Assistant Examiner* — Nigel Plumb
(74) *Attorney, Agent, or Firm* — Fogg & Powers LLC (57) ABSTRACT

An integrated reference vacuum pressure sensor with an atomic layer deposition (ALD) coated input port comprises a housing with an port for a media to enter the housing; a substrate and stress isolation member in the housing; wherein a channel extends through the substrate and the stress isolation member, wherein a trace is embedded within the stress isolation member, wherein stress isolation member and substrate surfaces exposed to the channel are coated with an ALD; a sensor die bonded to the stress isolation member, the sensor die comprising a diaphragm having circuitry, wherein a side of the diaphragm is exposed to the channel and the circuitry is mounted to another side of the diaphragm; a via extending through the sensing die electrically connecting the circuitry to the trace; and a cover bonded to the stress isolation member, the cover having a recess, the sensor die in the recess.

10 Claims, 4 Drawing Sheets

(56) References Cited

U.S. PATENT DOCUMENTS

2010/0281994 A1* 11/2010 Brown et al. ............... 73/729.1
2011/0283802 A1   11/2011 Brown et al.
2013/0031985 A1*  2/2013 Wade et al. ................. 73/753

OTHER PUBLICATIONS

Great Britian Patent Office, "Combined Search and Examination Report", Jul. 30, 2014, pp. 1-5, Published in: GB.

* cited by examiner

INTEGRATED REFERENCE VACUUM PRESSURE SENSOR WITH ATOMIC LAYER DEPOSITION COATED INPUT PORT

BACKGROUND

Silicon pressure sensors offer multiple benefits that include small size, good quality, and stable performance. Further, since multiple identical sensors can be fabricated simultaneously on a single wafer, silicon pressure sensors are also cost effective to manufacture. In at least one example of a pressure sensor, piezo-resistive silicon structures are fabricated on a diaphragm such that the piezo-resistive structures sense the strain in the diaphragm as the diaphragm reacts to pressure applied by the pressure media. However, strain caused by the support structures of the diaphragm may cause changes in sensor output. Some of the materials used to manufacture the support structures may be hygroscopic. When the support structures are hygroscopic, the physical size of the support structures change as the support structures absorb moisture in the air. The change in physical size changes the stress on the diaphragm, which commensurately changes sensor output and causes sensing errors.

In addition, when the pressure sensor is used to measure the absolute pressure in an environment, a stable reference vacuum may be provided around a side of the sensor's pressure sensing diaphragm that is opposite to the side of the sensing diaphragm that is exposed to a pressure media. Over time, materials in the reference vacuum can outgas. The out gassing of materials within the reference vacuum change the pressure difference between different sides of the diaphragm which causes drift errors in sensor measurements.

SUMMARY

An integrated reference vacuum pressure sensor with an atomic layer deposition coated input port is provided. In one implementation, a pressure sensor comprises a housing, the housing comprising an input port configured to allow a media to enter the interior of the housing when the housing is placed in an environment containing the media; a substrate securely mounted within the housing; and a stress isolation member mounted to the substrate, wherein a channel extends from an end of the input port through the substrate and the stress isolation member, wherein at least one trace is embedded within the stress isolation member, wherein the surfaces of the stress isolation member and the substrate that face the channel and the input port are coated with an atomic layer deposition. The pressure sensor further comprises a sensor die bonded to the stress isolation member, the sensor die comprising a diaphragm having sensing circuitry formed thereon, wherein a first side of the diaphragm is exposed to an opening of the channel in the stress isolation member and the sensing circuitry is mounted to a second side of the diaphragm that is hermetically sealed from the opening of the channel in the stress isolation member; at least one via extending through the sensing die, the via electrically connecting the sensing circuitry to the at least one trace; and a vacuum reference cover hermetically bonded to the stress isolation member, the vacuum reference cover having a recess containing a vacuum formed therein, wherein the sensor die is located within the recess and the sensing circuitry is exposed to the vacuum.

DRAWINGS

Understanding that the drawings depict only exemplary embodiments and are not therefore to be considered limiting in scope, the exemplary embodiments will be described with additional specificity and detail through the use of the accompanying drawings, in which.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

In at least one embodiment, moisture absorption, due to hygroscopic support materials of the diaphragm on a sensor die, is avoided by coating surfaces of the hygroscopic support materials that are exposed to air with a protective layer through atomic layer deposition. For example, a sensor die containing a diaphragm may be mounted on a stress isolation member (like a pedestal) that has a channel extending through the stress isolation member so that a pressure media can pass through the channel and exert pressure on the diaphragm. Further, the stress isolation member can be mounted on a substrate, where the channel also extends through the substrate. To prevent the surfaces of the substrate and the stress isolation member from absorbing moisture in a pressure media, the surfaces of the substrate and the stress isolation member that are exposed to the pressure media are coated with a protective layer through an atomic layer deposition process.

In a further implementation, a vacuum reference cover is bonded over the sensor die to inhibit out gassing within a reference vacuum for the diaphragm. To enable the bonding of the vacuum reference cover, circuitry on the diaphragm is electrically connected to external circuitry through a via that extends through the sensor die and contacts metallic traces that are embedded within the stress isolation member. The traces extend through the stress isolation member to interconnects that connect the traces to front end circuitry and external systems. The vacuum reference cover prevents components, other than the sensor circuitry formed on the diaphragm, from being exposed to the reference vacuum. Also, the limiting of components exposed to the reference vacuum also limits the amount of out gassing that occurs within the reference vacuum. In certain embodiments, the vacuum reference cover also includes a getter to preserve the vacuum within the reference vacuum.

Figure 1A:
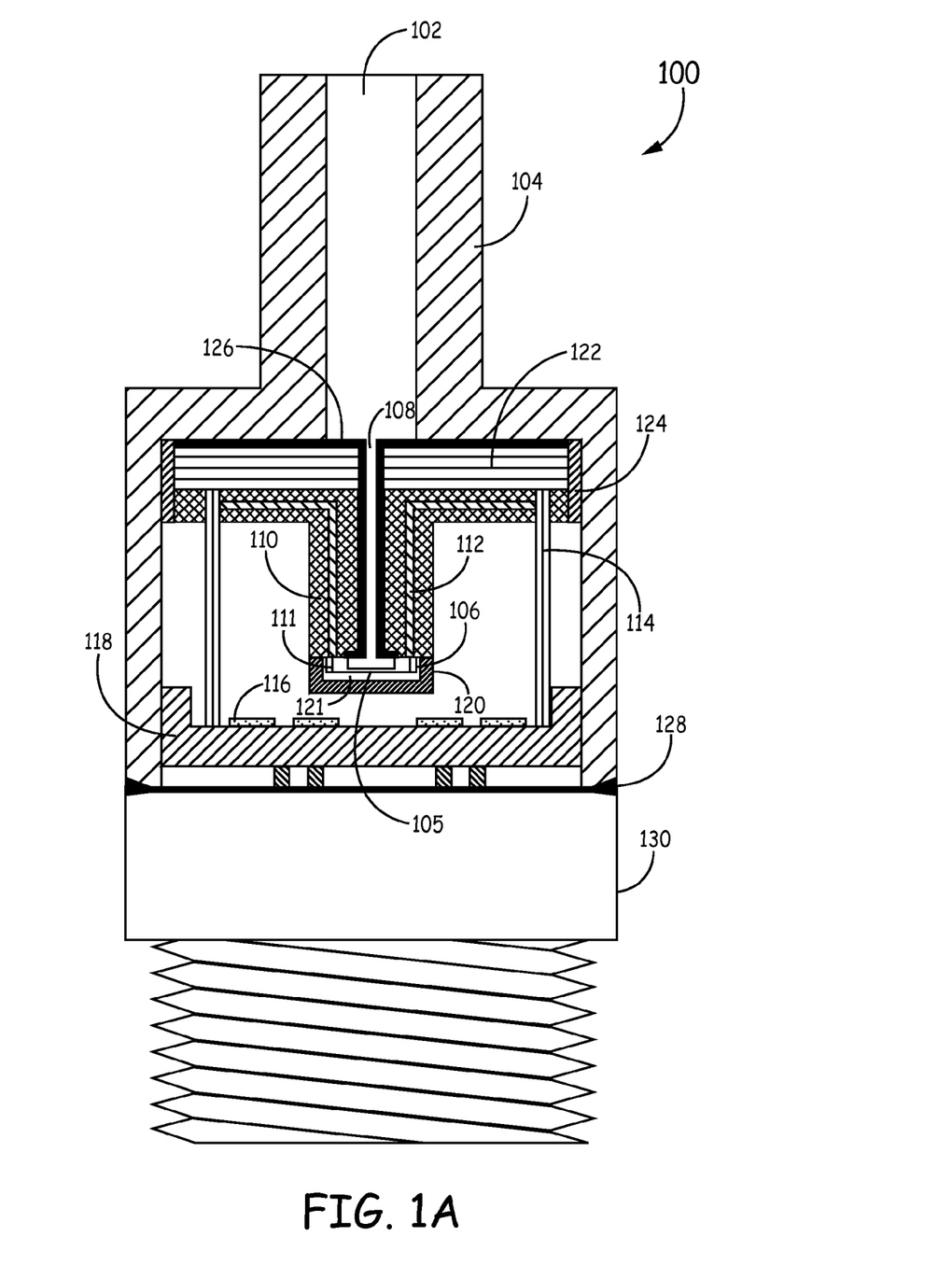
FIGS. 1A and 1B are diagrams illustrating cross sectional views of a pressure sensing device in different embodiments described in the present disclosure.

FIG. 1A is a cross-section view of a pressure sensing device 100. The pressure sensing device 100 is capable of measuring the pressure in certain media. For example, the pressure media sensed by the pressure sensing device 100 may include air or a liquid. To sense the pressure of the pressure media, the pressure sensing device 100 includes an input port 102, wherein the input port 102 allows the pressure media to enter a housing 104. The housing 104 protects the pressure sensing device 100 from environmental influences that can damage the pressure sensing device 100 or affect the performance of the pressure sensing device 100.

To sense the pressure of the pressure media inside the housing 104, the pressure sensing device 100 includes a sensor die 106. In at least one implementation, the sensor die 106 is a piezo-resistive silicon pressure sensing die, where piezo-resistive silicon structures formed on a silicon diaphragm 105 respond to strain in the diaphragm 105. In at least one embodiment, to expose the sensor die 106 to the pressure media, the pressure media enters the housing 104 through the input port 102 and then passes through a channel 108 in a stress isolation member 110. The pressure media within the channel 108 applies a force against the sensor die 106, which force causes the piezo-resistive silicon structures to strain as a diaphragm 105 in the sensor die 106 moves in accordance with the pressure applied by the pressure media. The strain on the piezo-resistive silicon structure changes the resistance of piezo-resistive elements in the piezo-resistive silicon structure. As a known current passes through the piezo-resistive silicon structure, the voltage drop due to the resistance of the piezo-resistive elements may be used to determine the pressure of the pressure media against the diaphragm of the sensor die 106.

Stress to the housing 104 may affect the components of the pressure sensing device 100 that are located within the housing 104. While some of the components within the housing are minimally affected by stress, strain on the piezo-resistive silicon structure located on the sensor die 106, caused by stress on the housing 104, can negatively affect the accuracy of pressure measurements made by the pressure sensing device 100. For example, strain on the housing 104 may strain the sensor die 106 in a way that is similar to the strain applied to the diaphragm 105 of the sensor die 106 by a pressure media, which leads to bias in pressure measurements derived from the sensor die 106. In certain implementations, to isolate the sensor die 106 from stress on the housing 104 or other components in the sensing device 100, the sensor die 106 is mounted on a stress isolation member 110. The stress isolation member 110 isolates the sensor die 106 from strain applied on the housing 104 or caused by other components within the housing 104. For example, the stress isolation member 110 may include a pedestal having the sensor die mounted there on, where the pedestal isolates the sensor die within the housing 104 from physical forces that affect the housing 104 or other components of the pressure sensing device 100.

In certain embodiments, to further prevent strain from affecting the precision of pressure measurements by the sensor die 106, the stress isolation member 110 is manufactured from a material that has a similar coefficient of thermal expansion (CTE) as the sensor die 106. For example, when the sensor die 106 is fabricated from silicon, the stress isolation member 110 is fabricated from a material having substantially the same CTE as silicon. Thus, when the stress isolation member 110 and/or sensor die 106 experience thermal expansion, the stress isolation member 110 and the sensor die 106 expand at the same rate to prevent thermal expansion from applying stress to the piezo-resistive elements formed on the sensor die 106. In at least one exemplary implementation, the sensor die 106 is fabricated from a silicon matching low temperature co-fired ceramic (SM-LTCC). In further embodiments, when the stress isolation member 110 is fabricated, the sensor die 106 is bonded to the stress isolation member 110 using a thermoelectric bonding process or other process for bonding the sensor die 106 to the stress isolation member 110.

In at least one implementation, to facilitate electrical connections between electronics on the diaphragm of the sensor die 106, a metalized via 111 (described below in relation to FIG. 2) is formed through the sensor die 106. Further, during the fabrication of the stress isolation member 110, embedded traces 112 are formed within the stress isolation member 110. The embedded traces 112 electrically connect to the vias formed in the sensor die 106 and extend through the stress isolation member 110 to interconnect pins 114 that extend from the stress isolation member 110 to front end circuitry 116 formed on a circuit wafer 118 located within the housing 104.

In certain embodiments, one side of the diaphragm 105 of the sensor die 106 is exposed to the pressure media in the channel 108 and an opposite side of the diaphragm 105 is exposed to a reference vacuum 121. In certain implementations, various components within the reference vacuum 121 can outgas over time. The out gassing of the various components changes the pressure within the reference vacuum, which changing of the pressure in the reference vacuum also changes the amount of strain experienced by the piezo-resistive elements on the diaphragm 105 of the sensor die 106 when the diaphragm 105 is exposed to the pressure media. The change in the pressure difference between the reference vacuum 121 and the pressure media due to pressure changes in the reference vacuum 121 causes errors in the pressure measurements. To limit the potential out gassing of materials from the various components into the reference vacuum 121, the diaphragm 105 can be sealed within a vacuum reference cover 120, where the vacuum reference cover 120 limits the number of possible out gassing components that are exposed to the reference vacuum.

Figure 1B:
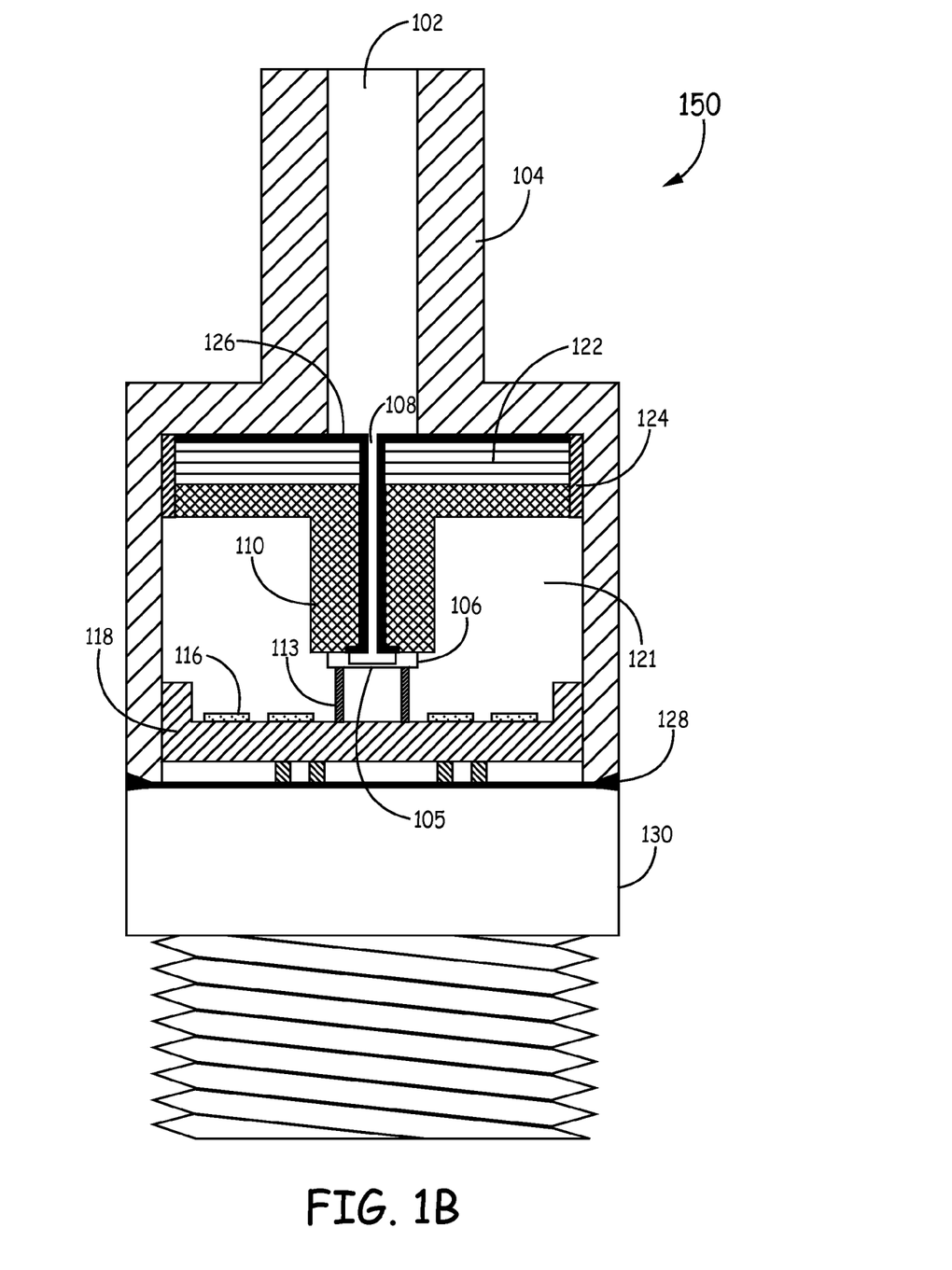

In certain implementations, the vacuum reference cover 120 is enabled by the through sensor vias 111 and the embedded traces 112 when the sensor die 106 is mounted onto the stress isolation member 110. The vias 111 and the embedded traces 112 allow electrical connections from the piezo-resistive elements formed on the diaphragm 105 to extend through the sensor die 106 and the stress isolation member 110 to the interconnect pins 114, where the electrical connection extends to a circuit wafer 118 containing front end circuitry 116. For example, FIG. 1B illustrates an alternative implementation of a pressure sensing device 150, where the pressure sensing device 150 does not have a vacuum reference cover 120 or vias 111 in FIG. 1A. As shown in FIG. 1B, absent the vias 111 through the sensor die 106, the signals that extend through the piezo-resistive elements formed on the diaphragm 105 of the sensor die 106 are made through wires 113 that are bonded to a surface of the sensor die 106 within the reference vacuum 121, where the wires 113 extend directly from the sensor die 106 to the further electronics such as front end circuitry 116 on circuit wafer 118. If the wires 113 extend directly from the sensor die 106 to the front end circuitry 116, the front end circuitry 116, connecting wires 113, and front end circuitry 116 support structures (such as circuit wafer 118) would be within the reference vacuum 121 and the various components in the reference vacuum 121 could possibly out gas into the reference vacuum 121 and alter the performance of the pressure sensing device 150. In contrast, and as shown in FIG. 1A, the electrical connection vias 111 that extend through the sensor die 106 and the embedded traces 112 that extend through the stress isolation member 110 enable the bonding of the vacuum reference cover 120 over the sensor die 106 to limit the out gassing of possible materials within the reference vacuum to the electrical elements mounted on the surface of the diaphragm 105.

In at least one implementation, the vacuum reference cover 120 is a recessed cover that fits over the sensor die 106 that is applied over the sensor die 106 during the fabrication process when the sensor die 106 and the stress isolation member 110 are in the presence of a vacuum environment. The vacuum reference cover 120 can be fabricated from materials such as silicon or other materials such as SM-LTCC. Similar to the stress isolation member 110, the vacuum reference cover 120 may be fabricated from a material having the same CTE as the sensor die 106 and the stress isolation member 110. While the vacuum reference cover 120 and the stress-isolation member 110 are in a vacuum environment, the vacuum reference cover 120 is bonded to the stress isolation member 110 using thermoelectric bonding or other bonding methods that hermetically seal a vacuum between the sensor die 106 and the vacuum reference cover 120 within the recessed portion of the vacuum reference cover 120.

In at least one implementation, when the sensor die 106 and vacuum reference cover 120 are mounted on the stress isolation member 110, the stress isolation member 110 is mounted to a substrate 122. In certain exemplary implementations, the substrate 122 is formed as an alumina blank, or other brazeable material. Alternatively, the stress isolation member 110 is formed on the substrate 122 before the sensor die 106 and the vacuum reference cover 120 are bonded to the stress isolation member 110. In certain embodiments, multiple stress isolation members 110 are fabricated on a substrate 122. A sensor die 106 and a vacuum reference cover 120 can then be bonded to each of the stress isolation members 110. When the sensor dies 106 and the vacuum reference covers 120 are bonded to each of the stress isolation members 110, the multiple stress isolation members 110 are singulated into individual stress isolation members 110 mounted on a substrate 122 with a respective sensor die 106 and a respective vacuum reference cover 120.

When the stress isolation member 110 is mounted onto the substrate 122, the stress isolation member 110 and the substrate 122 is placed within the housing 104, where the stress isolation member 110 and the substrate 122 are securely bonded within the housing 104. For example, the stress isolation member 110 and the substrate 122 are securely bonded to the housing through braze 124. Alternatively, the stress isolation member 110 and the substrate 122 are securely bonded to the housing through a solder joint. In certain implementations, when the stress isolation member 110 is securely bonded within the housing 104, interconnect pins 114 are located in the stress isolation member 110 such that the embedded traces 112 within the stress isolation member 110 contact the interconnect pins 114. Alternatively, the interconnect pins 114 are located in the stress isolation member 110 before the stress isolation member 110 is securely bonded within the housing 104. When the interconnect pins 114 are located within the stress isolation member 110, a circuit wafer 118 containing the front end circuitry 116 is placed such that the interconnect pins 114 provide an electrical connection between the embedded traces 112 and the front end circuitry 116. The front end circuitry includes electronics that, in part, function to control the input to the electrical elements on the sensor die 106. For example, the front end circuitry 116 includes analog to digital converters, digital to analog converters, multi chip modules and the like. In at least one implementation, the front end circuitry 116 performs functionalities such as pressure output characterization, output signal conditioning, and the like.

In certain embodiments, the circuit wafer 118 is electrically connected to an electrical connector 130 that is welded to the housing 104 with a hermetic weld 128. The electrical connector 130 extends from the housing 104 and connects to an external system. For example, in the example shown in FIG. 1A, the electrical connector 130 is threaded to aid in the integration of the pressure sensing device 100 in a larger system. Thus, through the electrical connector 130, an external system is able to acquire pressure measurements from the piezo-resistive elements on the diaphragm of the sensor die 106.

In a further embodiment, the stress isolation member 110 may be manufactured from a hygroscopic material such as silicon, SM-LTCC, and the like. When a stress isolation member 110 is manufactured from a hygroscopic material, the stress isolation member 110 expands as the stress isolation member 110 absorbs moisture in the pressure media. If the stress isolation member 110 is exposed to moisture in the pressure media, the expansion of the stress isolation member 110 may expand in such a way that the piezo-resistive elements on the sensor die 106 become strained, thus causing a bias in the measurements produced by the piezo-resistive elements. In certain embodiments (illustrated in both FIGS. 1A and 1B), the stress isolation member 110 is protected from moisture by an atomic layer deposition (ALD) coating 126 that prevents the moisture in the pressure media from contacting the stress isolation member 110. For example, the ALD coating 126 includes a coating of metal oxide that is deposited on the surfaces of the stress isolation member 110 and the substrate 122 that are exposed to the pressure media. In one exemplary implementation, the ALD coating 126 is applied before the stress isolation member 110 and the substrate 122 are mounted within the housing 104. Alternatively, the ALD coating 126 is applied after the stress isolation member 110 and the substrate 122 are mounted within the housing 104.

As described above, the use of vias 111 and embedded traces 112 that electrically connect the sensing circuitry (described below as sensing circuitry 207 in FIG. 2) on the sensor die 106 to the front end circuitry 116 enable the use of vacuum reference cover 120 over the sensor die 106. The vacuum reference cover 120 prevents out gassing of materials within the reference vacuum 121 from affecting the pressure within the reference vacuum 121 by limiting the number of components within the reference vacuum 121. Further, an ALD coating 126 over the stress isolation member 110 prevents hygroscopic components of the pressure sensing device 100 from absorbing moisture from the pressure media. By preserving the reference vacuum and preventing absorption of moisture by hygroscopic components, the pressure sensing device 100 is more resistant to possible sources of error in the pressure measurements.

Figure 2:
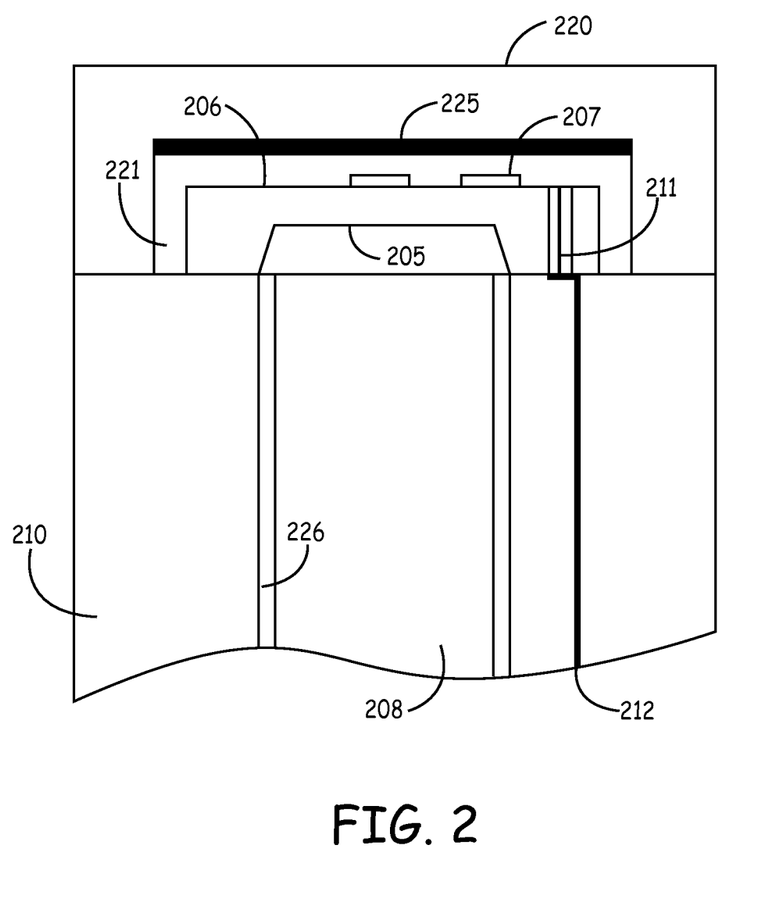
FIG. 2 is a diagram illustrating a cross sectional view of a sensor die mounted on a stress isolation member in one embodiment described in the present disclosure.

FIG. 2 is a cross section diagram of a sensor die 206 mounted on top of a stress isolation member 210, where the stress isolation member 210 is a pedestal. In certain embodiments, the stress isolation member 210 functions as stress isolation member 110 in FIG. 1A. Also similar to stress isolation member 110, a channel 208 extends through the stress isolation member 210. The channel 208 allows a pressure media to pass through the stress isolation member 110.

In at least one embodiment, the stress isolation member 210 isolates the sensor die 206 from stress that can affect the accuracy of sensor measurements. The sensor die 206 can also function as an embodiment of sensor die 106 in FIG. 1A. The sensor die 206 includes a diaphragm 205 and piezo-resistive elements 207. The diaphragm 205 is located over the channel 208 that extends through the stress isolation member 210 and moves according to the pressure of the pressure media within the channel 208. To measure the pressure, the sensor die 206 includes the piezo-resistive elements 207, which are mounted on the side of the diaphragm 205 opposite the channel 208. As the diaphragm 205 moves in response to the pressure of the pressure media, the movement exerts a straining force on the piezo-resistive elements 207. The strain on the piezo-resistive elements 207 changes the resistance of the piezo-resistive elements 207, which affects the measurable voltage of currents passed through the piezo-resistive elements 207. In at least one embodiment, the piezo-resistive elements 207 include both pressure sensing elements and temperature sensing elements.

In certain embodiments, the piezo-resistive elements 207 electrically connect to metalized vias 211. The metalized vias 211 then connect to embedded traces 212 formed within the stress isolation member 210. The embedded traces 212 extend through the stress isolation member 210 to provide a connection to front end circuitry, such as front end circuitry 116 described above in relation to FIG. 1A. As described above, the embedded traces 212 and the metalized vias 211 allow a vacuum reference cover 220 to be placed over the sensor die 206 and bonded to the stress isolation member 210 without interfering with electrical connections between the piezo-resistive elements 207 and front end circuitry. In at least one alternative implementation, a getter 225 may be placed within the recessed portion of the vacuum reference cover 220 above the sensor die 206, where the getter 225 is activated according to methods known to those having skill in the art. The getter 225 absorbs any remnant gaseous molecules present in the reference vacuum 221 after bonding and absorbs molecules that are out gassed from elements in the reference vacuum 221 after bonding.

Further, when the stress isolation member 210 is fabricated from a silicon material, and when the silicon material interacts with air in the pressure media, a layer of hygroscopic silicon dioxide forms. The silicon dioxide absorbs moisture out the air and causes the stress isolation member 210 to change shape. To prevent the stress isolation member 210 from absorbing moisture out of the air, the surfaces of the stress isolation member that are exposed to air through the channel are coated with an atomic layer deposition coating 226. In at least one embodiment, the coating 226 is a metal oxide such as alumina or titanium oxide. The coating 226 prevents moisture from being absorbed by portions of the stress isolation member 210 and prevents moisture from negatively affecting the operation of the pressure sensor.

Figure 3:
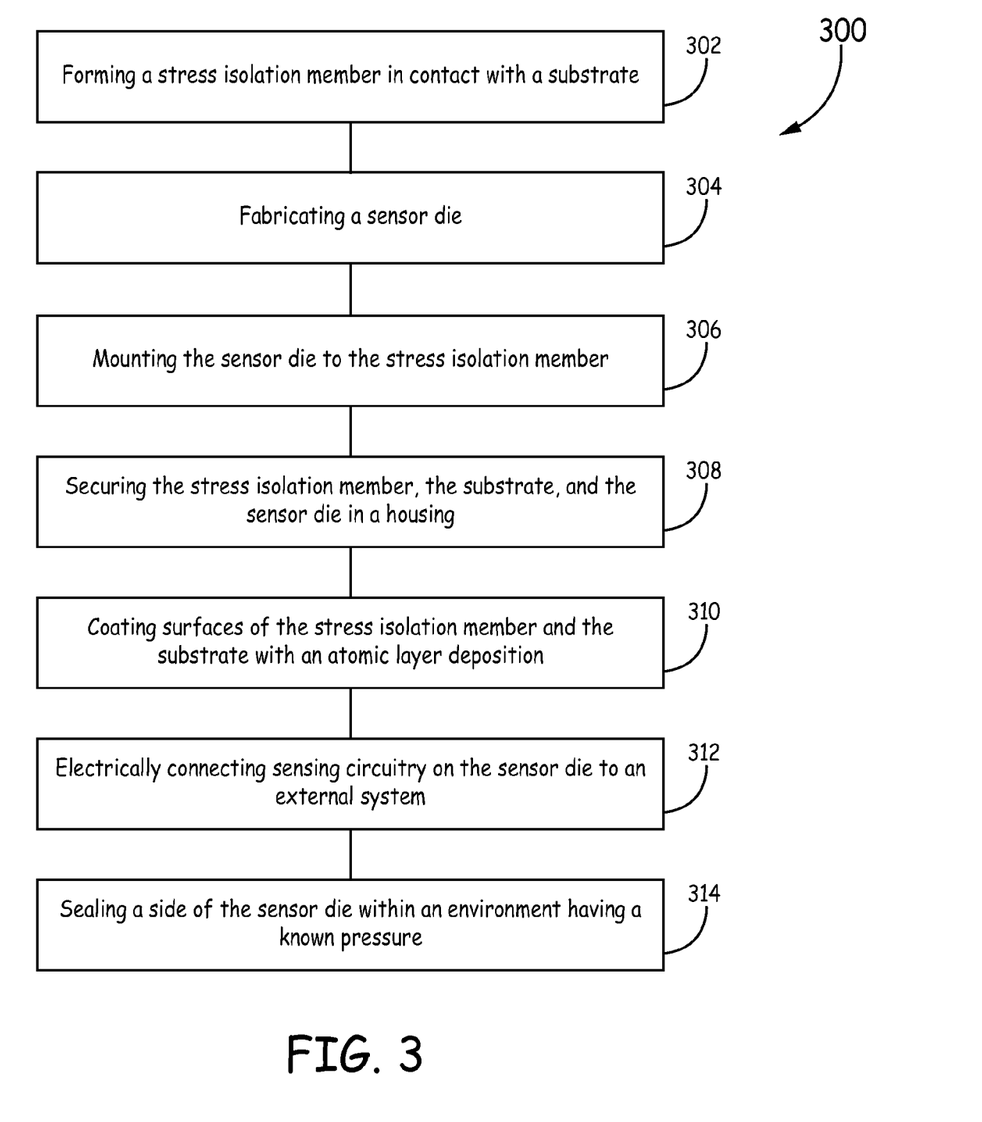
FIG. 3 is a flow diagram illustrating a method for fabricating a pressure sensor in one embodiment described in the present disclosure.

FIG. 3 is a flow diagram of one exemplary embodiment of a method 300 for fabricating a pressure sensor. The exemplary embodiment shown in FIG. 3 is described here as being implemented using the pressure sensing device 100 shown in FIG. 1A, though it is to be understood that other embodiments can be implemented in other ways.

Method 300 proceeds at 302 where a stress isolation member 110 is formed in contact with a substrate 122. In certain embodiments, the stress isolation member 110 is formed from an SM-LTCC material on a substrate 122 formed of an alumina. In at least one embodiment, a channel 108 extends through both the stress isolation member 110 and the substrate 122 such that a gaseous or liquid media can pass through the channel 108. Also, the stress isolation member 110 may be a pedestal like shape, where the channel extends longitudinally through the pedestal of the stress isolation member 110.

Method 300 proceeds at 304 where a sensor die 106 is fabricated. The sensor die 106 includes a silicon diaphragm with sensor circuitry formed on the diaphragm. In at least one implementation, the sensor circuitry includes piezo-resistive elements that change resistance in accordance with movement of the diaphragm. When the sensor die 106 is fabricated, the method 300 proceeds at 306 where the sensor die 106 is mounted to the stress isolation member 110. In at least one implementation, the sensor die 106 is mounted to the stress isolation member 110 such that the diaphragm of the sensor die 106 is located over an opening of the channel 108. In at least one embodiment, the sensor circuitry on the sensor die 106 is connected to metalized vias that extend through the sensor die 106. When the sensor die 106 is mounted on the stress isolation member 110, the metalized vias are brought into contact with embedded traces 112 formed in the stress isolation member 110, such that the sensor circuitry is electrically connected to the embedded traces 112.

In certain embodiments, method 300 proceeds to 308 where the stress isolation member 110, the substrate 122, and the sensor die 106 are secured in a housing 104. For example, the assembled components are placed within a housing 104 having an input port 102 such that pressure media entering the input port 102 is able to enter the opening of the channel 108 on the substrate 122. Further, in at least one exemplary embodiment, the assembled components are secured within the housing 104 with a braze 124. Alternatively, the stress isolation member 110, the substrate 122, and the sensor die 106 are individually secured within the housing 104 as the components are assembled together.

Method 300 proceeds to 310 where surfaces of the stress isolation member 110 and the substrate 122 are coated with an atomic layer deposition. In certain implementations, the stress isolation member 110 and the substrate 122 can be fabricated from hygroscopic material. When the stress isolation member 110 and/or the substrate 122 are hygroscopic and exposed to moisture in the pressure media, the stress isolation member 110 and/or the substrate 122 can swell and cause strain in the sensor die 106 that causes measurement errors. To prevent the absorption of moisture, the surfaces of the stress isolation member 110 and the substrate 122 that are exposed to the pressure media in either the channel 108 or the input port 102 can be coated with an atomic layer deposition 126. In one implementation, the stress isolation member 110 and the substrate 122 are coated before the stress isolation member 110 and the substrate 122 are secured within the housing. Alternatively, the stress isolation member 110 and the substrate 122 are coated with the atomic layer deposition 126 after the stress isolation member 110 and the substrate 122 are secured within the housing 104.

In at least one implementation, method 300 proceeds to 312 where the sensing circuitry on the sensor die 106 is electrically connected to an external system. As described above, the sensing circuitry connects to vias in the sensor die 106 which are coupled to embedded traces 112 in the stress isolation member 110. To electrically connect the sensing circuitry to an external system, the embedded traces 112 can be connected through interconnects 114 with front end circuitry 116 that connects to an external system through an external connector 130. Alternatively, the sensing circuitry can connect through wires 111 that extend directly from the sensing circuitry to the front end circuitry 116.

Method 300 proceeds to 314 where a second side of the sensor die 106 is sealed within an environment having a known pressure. In certain implementations, where the sensor 100 is an absolute pressure sensor, the sensing circuitry measures the pressure of pressure media against an absolute vacuum. Alternatively, the sensing circuitry may measure the pressure of the pressure media against any known reference pressure. In at least one implementation, out gassing from material in the environment with the known pressure can cause errors in measurements provided by the sensing circuitry. To preserve the known pressure and prevent out gassing, a reference cover 120 is bonded to the stress isolation member 110 around the surface of the sensor die 106 that is opposite the surface in contact with pressure media in the channel 108. The reference cover 120 limits the amount of material that can outgas and change the reference pressure, causing subsequent pressure measurements to shift. Alternatively, the front end circuitry can also be hermetically sealed within the housing 104, where the sealing is done in an environment having a known pressure.

EXAMPLE EMBODIMENTS

Example 1 includes a method for fabricating a pressure sensor, the method comprising: forming a stress isolation member in contact with a substrate, wherein the stress isolation member and the substrate have a channel formed through the substrate and the stress isolation member; fabricating a sensor die, wherein the sensor die comprises a diaphragm having sensing circuitry formed thereon; mounting the sensor die to the stress isolation member, wherein a first side of the diaphragm is exposed to an opening of the channel; securing the stress isolation member, the substrate, and the sensor die in a housing having an input port, wherein the channel is positioned in the housing such that a pressure media entering the input port also enters the channel; coating surfaces of the stress isolation member and the substrate that are exposed to either the input port or the channel with an atomic layer deposition; electrically connecting the sensing circuitry to an external system; and sealing a second side of the sensor die within an environment having a known pressure, wherein the second side is hermetically isolated from the opening of the channel.

Example 2 includes the method of Example 1, wherein sealing the side of the sensor die within an environment having a known pressure comprises bonding a reference cover to the stress isolation member in the environment, the reference cover having a recess, wherein the sensor die is located within the recess.

Example 3 includes the method of Example 2, wherein the reference cover is fabricated from a material having the same coefficient of thermal expansion as the sensor die.

Example 4 includes the method of any of Examples 1-3, wherein forming the stress isolation member on the substrate comprises forming embedded conductive traces within the stress isolation member, wherein the embedded conductive traces electrically connect to the sensing circuitry.

Example 5 includes the method of Example 4, wherein fabricating the sensor die comprises forming vias through the sensor die, wherein the vias electrically connect the embedded conductive trace to the sensing circuitry when the sensor die is mounted to the stress isolation member.

Example 6 includes the method of any of Examples 1-5, wherein the stress isolation member is fabricated from a silicon coefficient of thermal expansion matching low temperature co-fired ceramic.

Example 7 includes the method of any of Examples 1-6, wherein the stress isolation member comprises a pedestal, extending away from a surface of the substrate, wherein the channel extends longitudinally through the pedestal, the sensor die being mounted to the pedestal, wherein the opening of the channel exposed to the first side of the diaphragm is in a side of the pedestal that is farthest from the substrate.

Example 8 includes the method of any of Examples 1-7, wherein the atomic layer deposition comprises a metal oxide.

Example 9 includes the method of any of Examples 1-8, wherein electrically connecting the sensing circuitry to an external system comprises: electrically connecting the sensing circuitry to front end circuitry within the housing; electrically connecting the front end circuitry to the external system through an external connector.

Example 10 includes the method of any of Examples 1-9, wherein the substrate and the stress isolation member are secured within the housing with at least one of a braze and solder joint.

Example 11 includes a pressure sensor, the sensor comprising: a housing comprising an input port configured to allow a media to enter the interior of the housing when the housing is placed in an environment containing the media; a substrate securely mounted within the housing; a stress isolation member mounted to the substrate, wherein a channel extends from an end of the input port through the substrate and the stress isolation member, wherein at least one trace is embedded within the stress isolation member; a sensor die bonded to the stress isolation member, the sensor die comprising a diaphragm having sensing circuitry formed thereon, wherein a first side of the diaphragm is exposed to an opening of the channel in the stress isolation member and the sensing circuitry is mounted to a second side of the diaphragm that is hermetically sealed from the opening of the channel in the stress isolation member; at least one via extending through the sensing die, the via electrically connecting the sensing circuitry to the at least one trace; and a vacuum reference cover hermetically bonded to the stress isolation member, the vacuum reference cover having a recess containing a vacuum formed therein, wherein the sensor die is located within the recess and the sensing circuitry is exposed to the vacuum.

Example 12 includes the pressure sensor of Example 11, wherein the stress isolation member comprises a pedestal extending away from a surface of the substrate, wherein the channel extends longitudinally through the pedestal, the sensor die being mounted to the pedestal, wherein the opening of the channel exposed to the first side of the diaphragm is in a side of the pedestal that is farthest from the substrate.

Example 13 includes the pressure sensor of any of Examples 11-12, wherein the vacuum reference cover is fabricated from a material having the same coefficient of thermal expansion as the sensor die.

Example 14 includes the pressure sensor of any of Examples 11-13, wherein the stress isolation member is fabricated from a silicon coefficient of thermal expansion matching low temperature co-fired ceramic.

Example 15 includes the pressure sensor of any of Examples 11-14, further comprising an atomic layer deposition coating that covers surfaces of the stress isolation member and the substrate that are exposed to either the input port or the channel with an atomic layer deposition;

Example 16 includes the pressure sensor of Example 15, wherein the atomic layer deposition comprises a metal oxide.

Example 17 includes the pressure sensor of any of Examples 11-16, further comprising: a front end circuitry located within the housing, the front end circuitry being electrically connected to the at least one trace; and an external connector providing an electrical connection between the front end circuitry and an external system.

Example 18 includes the pressure sensor of any of Examples 11-17, wherein the substrate and the stress isolation member are secured within the housing with at least one of a braze and solder joint.

Example 19 includes the pressure sensor of any of Examples 11-18, wherein the vacuum reference cover comprises a getter located within the recess.

Example 20 includes a pressure sensor, the sensor comprising: a housing, the housing comprising an input port configured to allow a media to enter the interior of the housing when the housing is placed in an environment containing the media; a substrate securely mounted within the housing; a stress isolation member mounted to the substrate, wherein a channel extends from an end of the input port through the substrate and the stress isolation member, wherein at least one trace is embedded within the stress isolation member, wherein surfaces of the stress isolation member and the substrate that face the channel and the input port are coated with an atomic layer deposition; a sensor die bonded to the stress isolation member, the sensor die comprising a diaphragm having sensing circuitry formed thereon, wherein a first side of the diaphragm is exposed to an opening of the channel in the stress isolation member and the sensing circuitry is mounted to a second side of the diaphragm that is hermetically sealed from the opening of the channel in the stress isolation member; at least one via extending through the sensing die, the via electrically connecting the sensing circuitry to the at least one trace; and a vacuum reference cover hermetically bonded to the stress isolation member, the vacuum reference cover having a recess containing a vacuum formed therein, wherein the sensor die is located within the recess and the sensing circuitry is exposed to the vacuum.

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

Terms of relative position as used in this application are defined based on a plane parallel to the conventional plane or working surface of a wafer or substrate, regardless of the orientation of the wafer or substrate. The term "horizontal" or "lateral" as used in this application is defined as a plane parallel to the conventional plane or working surface of a wafer or substrate, regardless of the orientation of the wafer or substrate. The term "vertical" refers to a direction perpendicular to the horizontal. Terms such as "on," "side" (as in "sidewall"), "higher," "lower," "over," "top," and "under" are defined with respect to the conventional plane or working surface being on the top surface of the wafer or substrate, regardless of the orientation of the wafer or substrate.

What is claimed is:

1. A pressure sensor, the sensor comprising:
   a housing comprising an input port configured to allow a media to enter the interior of the housing when the housing is placed in an environment containing the media;
   a substrate securely mounted within the housing;
   a stress isolation member mounted to the substrate, wherein a channel extends from an end of the input port through the substrate and the stress isolation member, wherein at least one trace is embedded within the stress isolation member;
   a sensor die bonded to the stress isolation member, the sensor die comprising a diaphragm having sensing circuitry formed thereon, wherein a first side of the diaphragm is exposed to an opening of the channel in the stress isolation member and the sensing circuitry is mounted to a second side of the diaphragm that is hermetically sealed from the opening of the channel in the stress isolation member;
   at least one via extending through the sensing die, the via electrically connecting the sensing circuitry to the at least one trace; and
   a vacuum reference cover hermetically bonded to the stress isolation member, the vacuum reference cover having a recess containing a vacuum formed therein, wherein the sensor die is located within the recess and the sensing circuitry is exposed to the vacuum.

2. The pressure sensor of claim 1, wherein the stress isolation member comprises a pedestal extending away from a surface of the substrate, wherein the channel extends longitudinally through the pedestal, the sensor die being mounted to the pedestal, wherein the opening of the channel exposed to the first side of the diaphragm is in a side of the pedestal that is farthest from the substrate.

3. The pressure sensor of claim 1, wherein the vacuum reference cover is fabricated from a material having the same coefficient of thermal expansion as the sensor die.

4. The pressure sensor of claim 1, wherein the stress isolation member is fabricated from a silicon coefficient of thermal expansion matching low temperature co-fired ceramic.

5. The pressure sensor of claim 1, further comprising an atomic layer deposition coating that covers surfaces of the stress isolation member and the substrate that are exposed to either the input port or the channel with an atomic layer deposition.

6. The pressure sensor of claim 5, wherein the atomic layer deposition comprises a metal oxide.

7. The pressure sensor of claim 1, further comprising:
   a front end circuitry located within the housing, the front end circuitry being electrically connected to the at least one trace; and
   an external connector providing an electrical connection between the front end circuitry and an external system.

8. The pressure sensor of claim 1, wherein the substrate and the stress isolation member are secured within the housing with at least one of a braze and solder joint.

9. The pressure sensor of claim 1, wherein the vacuum reference cover comprises a getter located within the recess.

10. A pressure sensor, the sensor comprising:
    a housing, the housing comprising an input port configured to allow a media to enter the interior of the housing when the housing is placed in an environment containing the media;
    a substrate securely mounted within the housing;
    a stress isolation member mounted to the substrate, wherein a channel extends from an end of the input port through the substrate and the stress isolation member, wherein at least one trace is embedded within the stress isolation member, wherein surfaces of the stress isolation member and the substrate that face the channel and the input port are coated with an atomic layer deposition;
    a sensor die bonded to the stress isolation member, the sensor die comprising a diaphragm having sensing circuitry formed thereon, wherein a first side of the diaphragm is exposed to an opening of the channel in the stress isolation member and the sensing circuitry is mounted to a second side of the diaphragm that is hermetically sealed from the opening of the channel in the stress isolation member;
    at least one via extending through the sensing die, the via electrically connecting the sensing circuitry to the at least one trace; and
    a vacuum reference cover hermetically bonded to the stress isolation member, the vacuum reference cover having a recess containing a vacuum formed therein, wherein the sensor die is located within the recess and the sensing circuitry is exposed to the vacuum.

* * * * *